United States Patent
Sugai et al.

(10) Patent No.: US 11,309,979 B2
(45) Date of Patent: Apr. 19, 2022

(54) ADAPTIVE IDENTIFICATION SYSTEM, ADAPTIVE IDENTIFICATION DEVICE, AND ADAPTIVE IDENTIFICATION METHOD

(71) Applicant: ALPINE ELECTRONICS, INC., Tokyo (JP)

(72) Inventors: Taku Sugai, Fukushima (JP); Nozomu Saito, Fukushima (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 163 days.

(21) Appl. No.: 16/939,425

(22) Filed: Jul. 27, 2020

(65) Prior Publication Data
US 2021/0036791 A1 Feb. 4, 2021

(30) Foreign Application Priority Data

Jul. 29, 2019 (JP) .............................. JP2019-138897

(51) Int. Cl.
| | | |
|---|---|---|
| H04B 17/391 | (2015.01) | |
| G06F 17/16 | (2006.01) | |
| H04R 3/04 | (2006.01) | |

(52) U.S. Cl.
CPC ........... *H04B 17/391* (2015.01); *G06F 17/16* (2013.01); *H04R 3/04* (2013.01)

(58) Field of Classification Search
None
See application file for complete search history.

(56) References Cited

U.S. PATENT DOCUMENTS

| | | | | |
|---|---|---|---|---|
| 5,469,087 A | * | 11/1995 | Eatwell ............ | G10K 11/17875 327/40 |
| 2003/0031242 A1 | * | 2/2003 | Awad ................. | H03H 21/0012 375/232 |
| 2011/0090973 A1 | * | 4/2011 | Mishra ................ | H04L 27/2688 375/343 |

FOREIGN PATENT DOCUMENTS

| | | |
|---|---|---|
| JP | 2007-281860 | 10/2007 |
| JP | 2013-063208 | 4/2013 |

OTHER PUBLICATIONS

Extended European Search Report for 20187820.4 dated Jan. 14, 2021.

* cited by examiner

*Primary Examiner* — James K Mooney
(74) *Attorney, Agent, or Firm* — Ipusa, PLLC

(57) ABSTRACT

An adaptive identification system, for identifying a propagation system characteristic by an adaptive filter, includes a signal generator that generates an identification input signal including a frequency component of an integer multiple of a fundamental frequency and having a periodicity satisfying a PE condition, a setting unit that sets moving average time to a fundamental period of the identification input signal, and an adaptive algorithm execution unit that uses a moving average value and a diagonal matrix to update a coefficient of the adaptive filter, the moving average value being obtained by calculating a moving average of a cross-correlation vector of a vector of the identification input signal and an observation signal with the moving average time, and the diagonal matrix being obtained by diagonalizing a matrix obtained by calculating a moving average of an autocorrelation matrix of the vector of the identification input signal with the moving average time.

10 Claims, 11 Drawing Sheets

FIG.5

| | CALCULATION AMOUNT OF APPROXIMATE STEEPEST DESCENT ALGORITHM | CALCULATION AMOUNT OF PRESENT EMBODIMENT |
|---|---|---|
| CALCULATION AMOUNT FOR 2 TAPS | GRADIENT ESTIMATION<br>MULTIPLICATION: 9<br>ADDITION: 19<br>STEP SIZE ADJUSTMENT<br>MULTIPLICATION: 2<br>ADAPTIVE UPDATE<br>ADDITION: 2 | GRADIENT ESTIMATION<br>MULTIPLICATION: 6<br>ADDITION: 8<br>STEP SIZE ADJUSTMENT<br>MULTIPLICATION: 2<br>ADAPTIVE UPDATE<br>ADDITION: 2 |
| CALCULATION AMOUNT FOR 128 TAPS | GRADIENT ESTIMATION<br>MULTIPLICATION: 24,768<br>ADDITION: 41,536<br>STEP SIZE ADJUSTMENT<br>MULTIPLICATION: 128<br>ADAPTIVE UPDATE<br>ADDITION: 128 | GRADIENT ESTIMATION<br>MULTIPLICATION: 384<br>ADDITION: 512<br>STEP SIZE ADJUSTMENT<br>MULTIPLICATION: 128<br>ADAPTIVE UPDATE<br>ADDITION: 128 |
| CALCULATION AMOUNT FOR L TAPS | GRADIENT ESTIMATION<br>MULTIPLICATION: $L + L^2 + \left(L + \frac{L^2-L}{2}\right)$<br>ADDITION: $L + 3\left(2L + \frac{L^2-L}{2}\right)$<br>STEP SIZE ADJUSTMENT<br>MULTIPLICATION: $L$<br>ADAPTIVE UPDATE<br>ADDITION: $L$ | GRADIENT ESTIMATION<br>MULTIPLICATION: $3L$<br>ADDITION: $L + 3L$<br>STEP SIZE ADJUSTMENT<br>MULTIPLICATION: $L$<br>ADAPTIVE UPDATE<br>ADDITION: $L$ |

ADAPTIVE UPDATE EQUATION $$w(n+1) = w(n) + \mu\, x(n)\, e(n)$$

ADAPTIVE UPDATE EQUATION $$w(n+1) = w(n) + \mu \left[\frac{1}{M}\sum_{i=0}^{M-1}\{x(n-i)y(n-i)\}\right] - \mu \left[\frac{1}{M}\sum_{i=0}^{M-1}\{x(n-i)x(n-i)^T\}\right]w(n)$$

FIG.9 RELATED ART

LMS ALGORITHM (FOR TWO TAPS)

$$\begin{cases} w_0(n+1) = w_0(n) + \mu x(n)e(n) \\ w_1(n+1) = w_1(n) + \mu x(n-1)e(n) \end{cases}$$

CALCULATION AMOUNT REQUIRED FOR ONE ADAPTATION
GRADIENT ESTIMATION      MULTIPLICATION: 2
STEP SIZE ADJUSTMENT     MULTIPLICATION: 2
ADAPTIVE UPDATE          ADDITION: 2

APPROXIMATE STEEPEST GRADIENT ALGORITHM (FOR TWO TAPS)

$$w_0(n+1) = w_0(n)$$
$$+ \mu \frac{1}{M} \sum_{i=0}^{M-1} \{x(n-i)y(n-i)\} - \mu \frac{1}{M} \sum_{i=0}^{M-1} \{x(n-i)x(n-i)\}w_0(n) - \mu \frac{1}{M} \sum_{i=0}^{M-1} \{x(n-i)x(n-1-i)\}w_1(n)$$

$$w_1(n+1) = w_1(n) + \mu \frac{1}{M} \sum_{i=0}^{M-1} \{x(n-1-i)y(n-i)\} - \mu \frac{1}{M} \sum_{i=0}^{M-1} \{x(n-1-i)x(n-i)\}w_0(n) - \mu \frac{1}{M} \sum_{i=0}^{M-1} \{x(n-1-i)x(n-1-i)\}w_1(n)$$

$$w_0(n+1) = w_0(n) + \frac{\mu}{M} \left[ \sum_{i=0}^{M-1} \{x(n-i)y(n-i)\} - w_0(n) \sum_{i=0}^{M-1} \{x(n-i)x(n-i)\} - w_1(n) \sum_{i=0}^{M-1} \{x(n-i)x(n-1-i)\} \right]$$

$$w_1(n+1) = w_1(n) + \frac{\mu}{M} \left[ \sum_{i=0}^{M-1} \{x(n-1-i)y(n-i)\} - w_0(n) \sum_{i=0}^{M-1} \{x(n-1-i)x(n-i)\} - w_1(n) \sum_{i=0}^{M-1} \{x(x-1-i)x(x-1-i)\} \right]$$

CALCULATION AMOUNT REQUIRED FOR ONE ADAPTATION
GRADIENT ESTIMATION      MULTIPLICATION: 9    ADDITION: 19
STEP SIZE ADJUSTMENT     MULTIPLICATION: 2
ADAPTIVE UPDATE          ADDITION: 2

ADAPTIVE IDENTIFICATION SYSTEM, ADAPTIVE IDENTIFICATION DEVICE, AND ADAPTIVE IDENTIFICATION METHOD

CROSS-REFERENCE TO RELATED APPLICATIONS

This application is based on and claims priority to Japanese Patent Application No. 2019-138897, filed on Jul. 29, 2019, the entire contents of which are incorporated herein by reference.

BACKGROUND OF THE INVENTION

1. Field of the Invention

The disclosures herein relate to an adaptive identification system, an adaptive identification device, and an adaptive identification method.

2. Description of the Related Art

When signal processing of audio signals is performed for the purpose of reproducing original sounds, generating stereoscopic sounds, and reducing noises, for example, a characteristic of the sound propagation system from a speaker to a microphone installed at a control point (which is ideally an ear of a listener) is used.

A typical method for obtaining the characteristic of the sound propagation system is a technique called adaptive identification. The adaptive identification is a technique that models the sound propagation system by using an adaptive filter, and a least mean square (LMS) algorithm is widely used as an adaptive algorithm (see, for example, Patent Document 1).

When the adaptive identification is performed in an actual environment, the identification accuracy may be reduced due to an influence of disturbance, such as a noise, for example. In the LMS algorithm, although a decrease in the identification accuracy can be avoided by reducing the step size, there is a problem that it takes time to obtain a final identification result because the adaptation speed decreases when the step size is reduced.

To solve such a problem, it can be considered to use, for example, an adaptive algorithm that approximates a computation of an expected value in a steepest descent algorithm with a finite number of times time average (which will be hereinafter referred to as an approximate steepest descent algorithm) to reduce the time to obtain the final identification result. However, this method has a problem of significantly increasing the calculation amount of an adaptive identification system compared with the LMS algorithm.

One embodiment of the present invention has been made in view of the above problem so that in an adaptive identification system, the identification accuracy equivalent to the identification accuracy of the approximate steepest descent algorithm can be obtained with a calculation amount smaller than the calculation amount of the approximate steepest descent algorithm.

RELATED-ART DOCUMENTS

Patent Documents

Patent Document 1: Japanese Laid-Open Patent Publication No. 2007-281860

SUMMARY OF THE INVENTION

According to an embodiment of the present invention, with respect to an adaptive identification system for identifying a characteristic of a propagation system by use of an adaptive filter, the adaptive identification system includes a signal generator configured to generate an identification input signal including a frequency component that is an integer multiple of a fundamental frequency, the identification input signal having a periodicity satisfying a PE condition, a setting unit configured to set moving average time to a fundamental period of the identification input signal, and an adaptive algorithm execution unit configured to use a moving average value and a diagonal matrix to update a coefficient of the adaptive filter, the moving average value being obtained by calculating a moving average of a cross-correlation vector of a vector of the identification input signal and an observation signal with the moving average time, and the diagonal matrix being obtained by diagonalizing a matrix obtained by calculating a moving average of an autocorrelation matrix of the vector of the identification input signal with the moving average time.

According to at least one embodiment of the present invention, in the adaptive identification system, identification accuracy equivalent to the identification accuracy of the approximate steepest descent algorithm can be obtained with a calculation amount smaller than the calculation amount of the approximate steepest descent algorithm.

BRIEF DESCRIPTION OF THE DRAWINGS

FIG. 5 is a drawing illustrating an example of a calculation amount of the adaptive identification system according to the embodiment;

FIG. 9 is a drawing illustrating an example of a calculation amount of the adaptive identification system of the related art.

DESCRIPTION OF THE EMBODIMENTS

In the following, an embodiment of the present invention will be described with reference to the accompanying drawings.

<Adaptive Identification System>

Before describing an adaptive identification system according to the present embodiment, an adaptive identification system of the related art will be briefly described.

Figure 6:
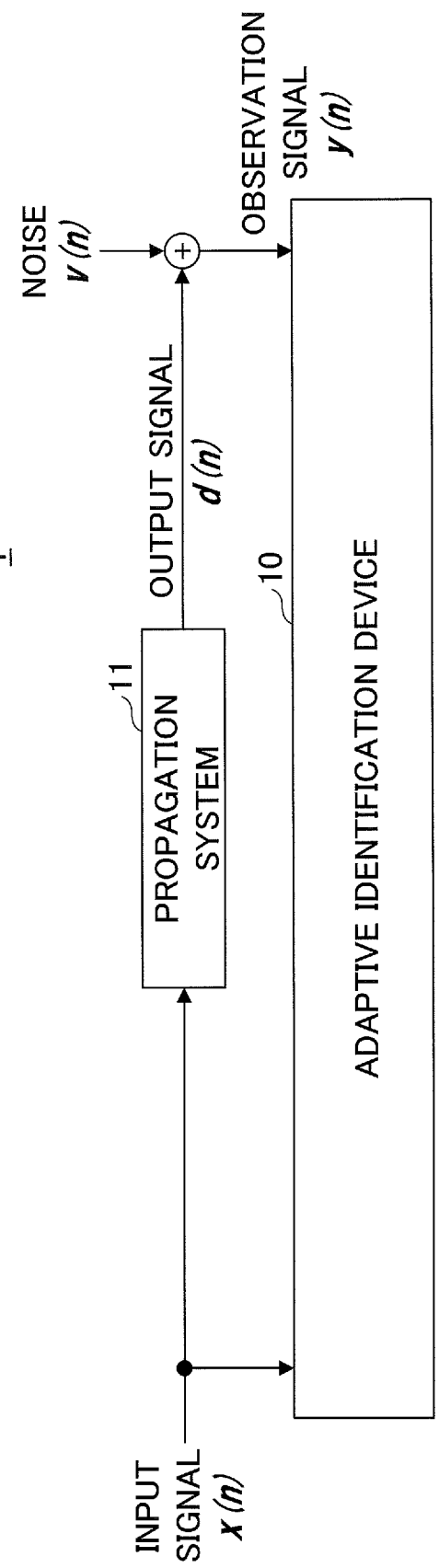
FIG. 6 is a drawing for describing an adaptive identification system of the related art.

FIG. 6 is a drawing for describing the adaptive identification system of the related art. An adaptive identification system 1 is a system for identifying a characteristic of a propagation system 11 of a sound or the like by using an adaptive identification device 10, for example. The adaptive identification device 10 adaptively identifies a characteristic of the propagation system 11 by using a predetermined adaptive algorithm based on an identification input signal x(n) and an output signal d(n) output from the propagation system 11, for example.

However, when adaptive identification is performed in the actual environment, there is a problem that the identification accuracy of the system is deteriorated because disturbance such as noise v(n) is mixed in an observation signal y(n) (i.e., an identification input signal convoluted with the propagation system including disturbance) input to the adaptive identification device 10.

Figure 7:
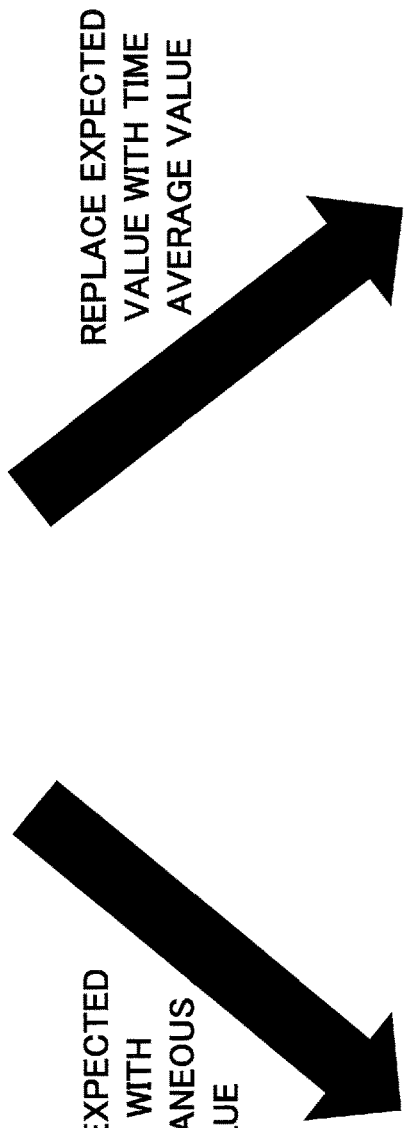
FIG. 7 is a drawing for describing an example of an adaptive identification algorithm of the related art.

FIG. 7 is a drawing for describing an example of an adaptive identification algorithm of the related art. The least mean square (LMS) algorithm is widely used as an adaptive algorithm in the adaptive identification system 1 of the related art.

The LMS algorithm is an adaptive algorithm based on a steepest descent method, which is a classic numerical analysis method for obtaining a local minimum value of a function f(w) of a vector w. FIG. 7 illustrates an equation of an adaptive algorithm using the steepest descent method (i.e., the steepest descent algorithm).

In the equation of the steepest descent algorithm, a calculation E[ ] indicates an expected value calculation to obtain the mean of an infinite number of trials. Thus, it is difficult to implement the equation of the steepest descent algorithm as an adaptive algorithm in the adaptive identification device 10.

Therefore, as an algorithm that can be implemented in the adaptive identification device 10, an equation of the LMS algorithm in which expected value calculations 20 and 21 of the steepest descent algorithm are replaced with instantaneous values 22 and 23, is widely used.

As another algorithm that can be implemented in the adaptive identification device 10, an adaptive algorithm in which the expected value calculations 20 and 21 of the steepest descent algorithm are approximated by a finite number of times time averages 24 and 25 (which is hereinafter referred to as an approximate steepest descent algorithm), is known.

(Adaptive Identification System Using the LMS)

Figure 8A:
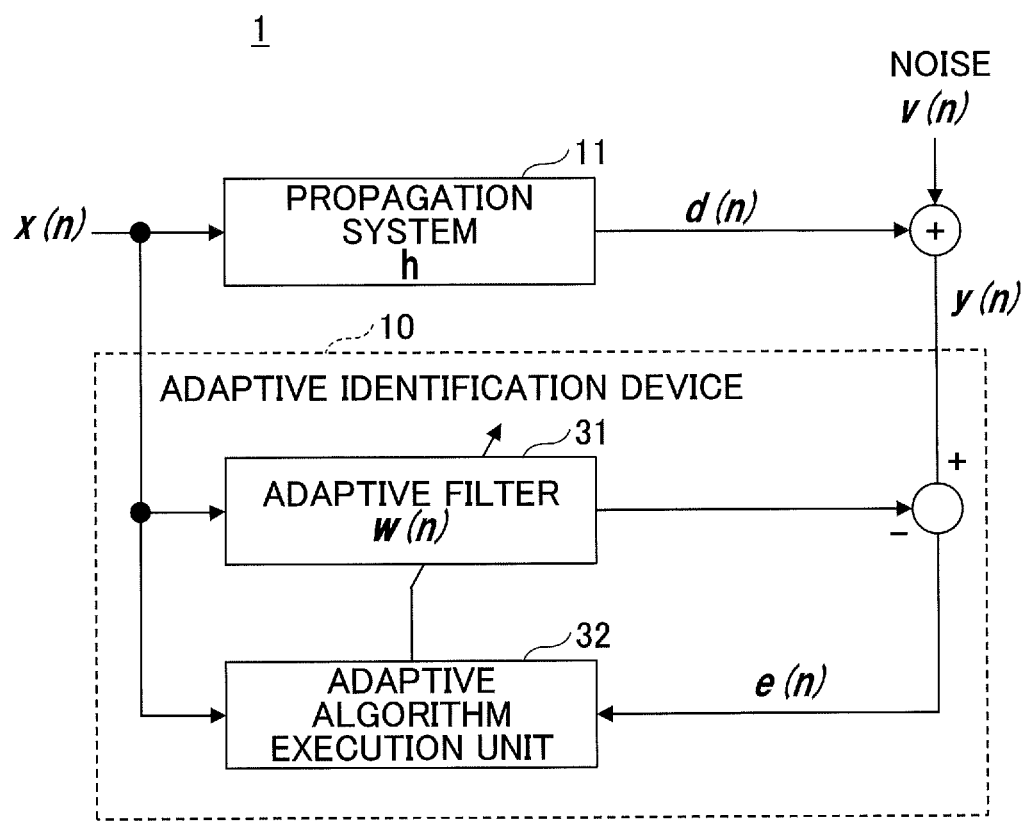
FIG. 8A and FIG. 8B are drawings illustrating examples of a system configuration of an adaptive identification system of the related art.

FIG. 8A illustrates an example of a system configuration of the adaptive identification system 1 using the LMS algorithm. In the example of FIG. 8A, the adaptive identification device 10 includes an adaptive filter 31 and an adaptive algorithm execution unit 32, and the adaptive algorithm execution unit 32 updates a transfer function w(n) of the adaptive filter 31 by using the equation of the LMS algorithm described in FIG. 7 as an adaptive update equation.

In the adaptive identification system 1 using the LMS algorithm, if there is no noise v(n) causing disturbance, and the propagation system 11 can be completely simulated by the transfer function w(n) of the adaptive filter 31, the adaptive filter 31 converges to a characteristic of the propagation system 11. That is, w(∞)=h.

However, if the noise v(n) causing disturbance is present, the adaptive filter 31 is influenced, does not converge to an optimum solution, and vibrates near the optimum solution. The larger the noise v(n) causing disturbance is, the larger the vibration becomes.

In such a case, in the adaptive identification system 1 using the LMS algorithm, the vibration can be reduced by setting a step size μ to be small. When the step size μ is set to be small, there is a problem that it takes more time to obtain a final result because an adaptation speed decreases.

(Adaptive Identification System Using the Approximate Steepest Descent Algorithm)

Figure 8B:
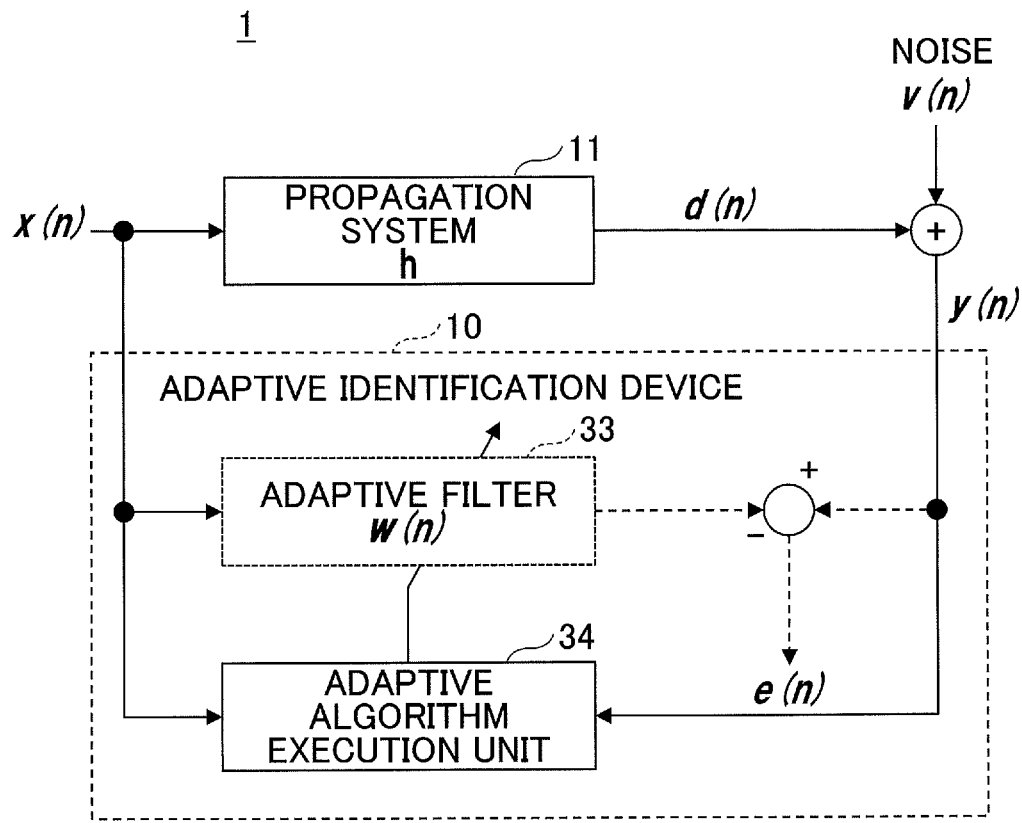

FIG. 8B illustrates an example of a system configuration of the adaptive identification system 1 using the approximate steepest descent algorithm. In the example of FIG. 8B, the adaptive identification device 10 includes an adaptive filter 33 and an adaptive algorithm execution unit 34, and the adaptive algorithm execution unit 34 updates a transfer function w(n) of the adaptive filter 33 by using the equation of the approximate steepest descent algorithm described in FIG. 7 as an adaptive update equation.

In the adaptive identification system 1 using the approximate steepest descent algorithm, the influence of the noise v(n) causing disturbance can be suppressed by time average to reduce the time to obtain the final result, without setting the step size μ to be small. However, there is a problem that the adaptive identification system 1 using the approximate steepest descent algorithm requires more calculations than the adaptive identification system 1 using the LMS algorithm.

FIG. 9 is a drawing illustrating an example of the calculation amount of the adaptive identification system. Here, for ease of description, the calculation amount of the LMS algorithm and the calculation amount of the approximate steepest descent algorithm required when the number of taps of the adaptive filter taps is two, are shown.

As illustrated in FIG. 9, in the adaptive identification system 1 using the LMS algorithm, the calculation amount for one adaptation requires two multiplications for a gradient estimation, two multiplications for a step size adjustment, and two additions for an adaptive update.

With respect to the above, in the adaptive identification system 1 using the approximate steepest descent algorithm, the calculation amount for one adaptation requires nine multiplications and 19 additions for the gradient estimation, and two multiplications for the step size adjustment, and two additions for the adaptive update. Here, as an example, the calculation amount is illustrated when three addition operations (data value addition, subtraction, and pointer increment) are performed for an addition operation of the moving average by using a ring buffer method.

In the actually used adaptive filter, the number of taps is, for example, 128 taps or greater in many cases. In such a case, the calculation amount in the adaptive identification system 1 using the approximate steepest descent algorithm becomes greater.

Thus, in the present embodiment, an adaptive identification system that achieves identification accuracy equivalent to the identification accuracy of the approximate steepest descent algorithm with a calculation amount smaller than the calculation amount of the approximate steepest descent algorithm, will be described.

<System Configuration>

Figure 1A:
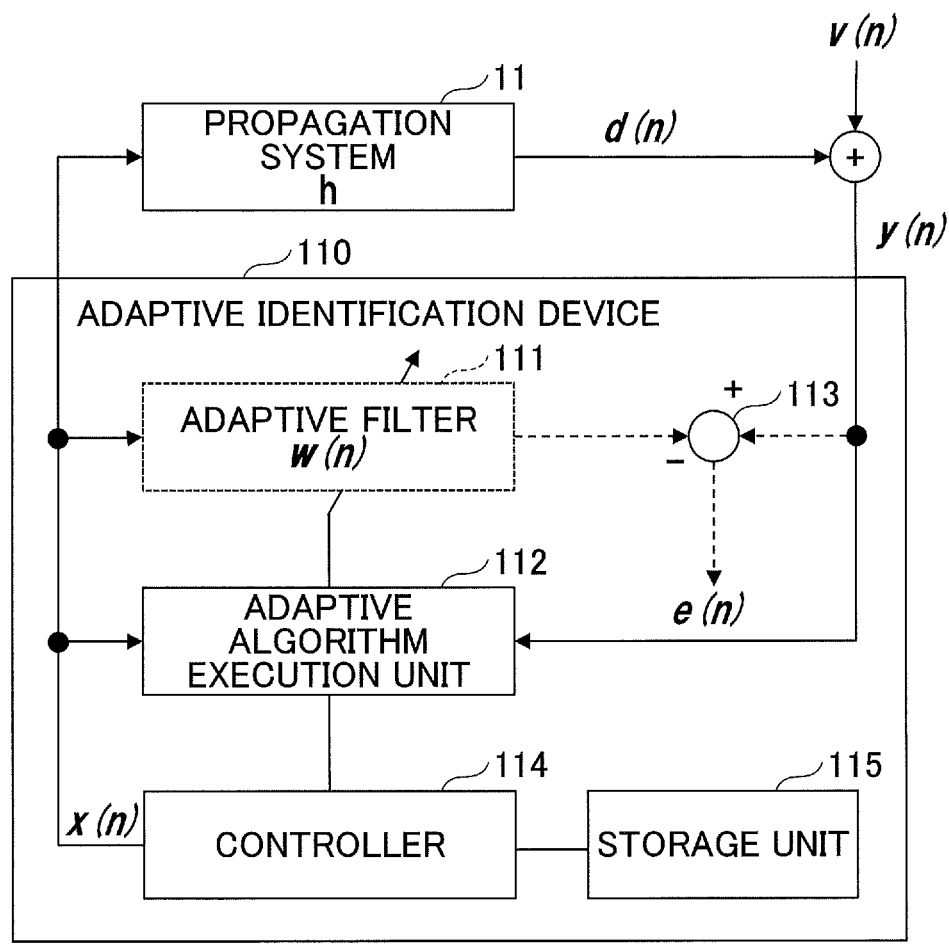
FIG. 1A and FIG. 1B are drawings illustrating examples of a system configuration of an adaptive identification system according to an embodiment.
Figure 1B:
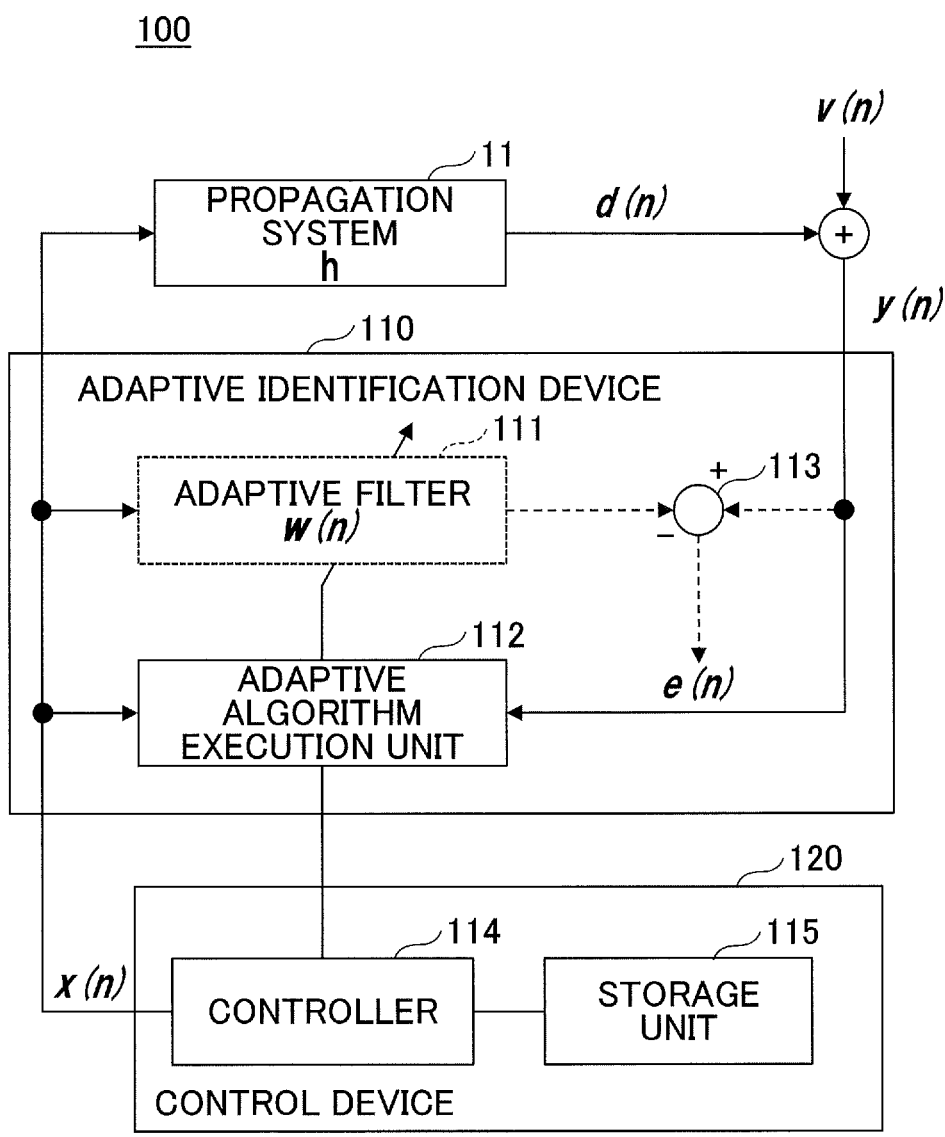

FIG. 1A and FIG. 1B are drawings illustrating examples of a system configuration of an adaptive identification system according to the embodiment.

FIG. 1A illustrates an example of a system configuration of an adaptive identification system 100 according to the present embodiment. An adaptive identification device 110 illustrated in FIG. 1A includes, for example, a controller 114 and a storage unit 115 in addition to the configuration of the adaptive identification device 10 of the related art illustrated in FIG. 8B. Specifically, the adaptive identification device 110 includes an adaptive filter 111, an adaptive algorithm execution unit 112, a subtractor 113, the controller 114, and the storage unit 115.

Since characters representing the vector and the matrix cannot be represented by bold letters in the description of the specification, the vector and the matrix are represented by standard letters in the description. In equations, the vector and the matrix are represented by bold letters. Thus, for example, the "vector x" in the description corresponds to the bold letter x of the equation. The same applies to the matrix and another character.

The adaptive filter 111 is implemented by a digital signal processor (DSP) provided by the adaptive identification device 110, for example, and is a finite impulse response (FIR) filter or the like that can change a coefficient vector w(n) by control from the adaptive algorithm execution unit 112.

The adaptive algorithm execution unit 112 is implemented by the DSP provided by the adaptive identification device 110, for example, and updates the coefficient vector w(n) of the adaptive filter 111 based on an identification input signal x(n) and an observation signal y(n) by using an adaptive update equation, which will be described later.

The subtractor 113 is implemented by the DSP provided by the adaptive identification device 110, for example, and outputs an error signal e(n) based on the observation signal y(n) and an output signal of the adaptive filter 111. In the present embodiment, the error signal e(n) is not directly used for an adaptive update, but the error signal e(n) is observed to see how close the coefficient vector w(n) of the adaptive filter 111 is to the characteristic of the propagation system 11 (h) to be obtained.

Figure 2:
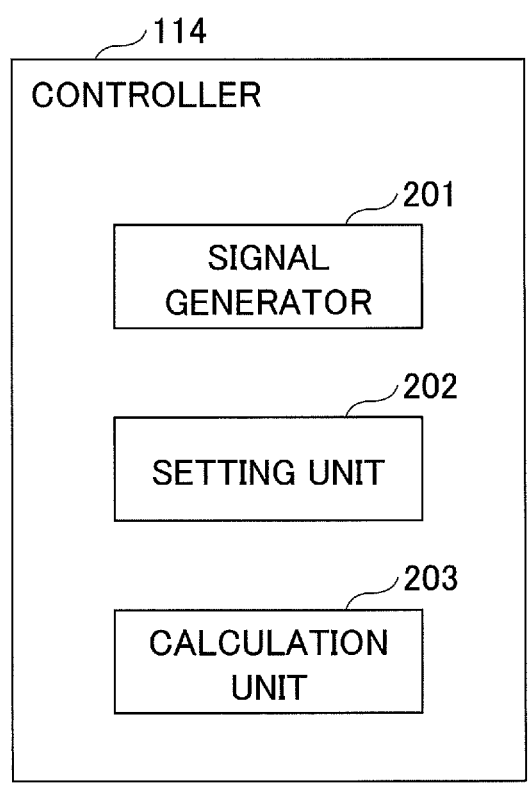
FIG. 2 is a drawing illustrating an example of a functional configuration of a controller according to the embodiment.

The controller 114 is implemented by, for example, a program executed by a computer provided by the adaptive identification device 110 or the DSP provided by the adaptive identification device 110, and has a functional configuration as illustrated in FIG. 2. The functional configuration of the controller 114 will be described later.

The storage unit 115 is implemented by, for example, a memory or a storage device provided by the adaptive identification device 110, and stores various information and data, which will be described later.

FIG. 1B illustrates another example of a system configuration of the adaptive identification system 100 according to the present embodiment. As illustrated in FIG. 1B, the controller 114 and the storage unit 115 of the adaptive identification system 100 may be a control device 120 outside of the adaptive identification device 110. For example, the control device 120 has a configuration of a computer including a central processing unit (CPU), a memory, a storage device, a communication interface, and the like. The control device 120 achieves the controller 114, the storage unit 115, and the like by the CPU executing a predetermined program.

<Function Configuration of the Controller>

FIG. 2 is a drawing illustrating an example of the functional configuration of the controller according to the embodiment. The controller 114 includes, for example, a signal generator 201, a setting unit 202, and a calculation unit 203.

The signal generator 201 generates the identification input signal x(n) of the adaptive identification system 100. The signal generator 201 may generate the identification input signal x (n) inside the signal generator 201, and may control the DSP provided by the adaptive identification device 110 to generate the identification input signal x (n), for example.

(Identification Input Signal)

Here, the identification input signal vector x(n) generated by the signal generator 201 will be described.

As described, the adaptive update equation of the approximate steepest descent algorithm is as follows.

$$w(n+1) = w(n) + \mu \left[ \frac{1}{M} \sum_{i=0}^{M-1} \{x(n-i)y(n-i)\} \right] - \mu \left[ \frac{1}{M} \sum_{i=0}^{M-1} \{x(n-i)x(n-i)^T\} \right] w(n) \quad \text{[Eq. 1]}$$

The approximate steepest descent algorithm calculates a moving average value of an autocorrelation matrix $x(n)x(n)^T$ of the identification input signal vector x(n), calculates a moving average of a cross-correlation vector x(n)y(n) of the identification input signal vector x(n) and the observation signal y(n), and calculates the product of the moving average value of the autocorrelation matrix and the coefficient vector w(n) of the current adaptive filter. The adaptive update equation calculates an adaptive filter coefficient vector for the next sampling by adding the moving average value of the cross-correlation vector to the product of the moving average value of the autocorrelation matrix and the value of the current adaptive filter coefficient vector.

Here, the autocorrelation matrix is expressed as follows.

$$\frac{1}{M} \begin{bmatrix} \sum_{i=0}^{M-1} \{x(n-i)x(n-i)\} & \sum_{i=0}^{M-1} \{x(n-i)x(n-1-i)\} & \cdots & \sum_{i=0}^{M-1} \{x(n-i)x(n-L+1-i)\} \\ \sum_{i=0}^{M-1} \{x(n-1-i)x(n-i)\} & \sum_{i=0}^{M-1} \{x(n-1-i)x(n-1-i)\} & \cdots & \sum_{i=0}^{M-1} \{x(n-1-i)x(n-L+1-i)\} \\ \vdots & \vdots & \ddots & \vdots \\ \sum_{i=0}^{M-1} \{x(n-L+1-i)x(n-i)\} & \sum_{i=0}^{M-1} \{x(n-L+1-i)x(n-1-i)\} & \cdots & \sum_{i=0}^{M-1} \{x(n-L+1-i)x(n-L+1-i)\} \end{bmatrix} \quad \text{[Eq. 2]}$$

The moving average is calculated for each element of the matrix. Thus, the calculation amount of the moving averages becomes particularly large. Therefore, if the autocorrelation matrix can be simplified, the calculation amount can be greatly reduced.

In order to simplify the autocorrelation matrix, the signal generator 201 generates the identification input signal x(n) that includes a frequency component that is an integer multiple of the fundamental frequency, and that has a periodicity satisfying a condition of being persistently exciting (PE).

The signal generator 201, for example, combines multiple sine wave signals having an integer multiple of the fundamental frequency to generate a periodic signal including only a frequency component having an integer multiple of the fundamental frequency as the identification input signal x(n). At this time, in order to satisfy the order of PE, the signal generator 201 adds sine wave signals of frequencies Then, a matrix obtained by calculating the moving average of the autocorrelation matrix $x(n)x(n)^T$ of the identification input signal vector x(n), becomes a regular constant matrix, for example, as illustrated in the following equation.

$$\frac{1}{M} \sum_{i=0}^{M-1} \{x(n-i)x(n-i)^T\} = \begin{bmatrix} 4.0000 & 3.8547 & 3.4337 & 2.7795 & 1.9572 & 1.0471 & 0.1351 & -0.6968 \\ 3.8547 & 4.0000 & 3.8547 & 3.4337 & 2.7795 & 1.9572 & 1.0471 & 0.1351 \\ 3.4337 & 3.8547 & 4.0000 & 3.8547 & 3.4337 & 2.7795 & 1.9572 & 1.0471 \\ 2.7795 & 3.4337 & 3.8547 & 4.0000 & 3.8547 & 3.4337 & 2.7795 & 1.9572 \\ 1.9572 & 2.7795 & 3.4337 & 3.8547 & 4.0000 & 3.8547 & 3.4337 & 2.7795 \\ 1.0471 & 1.9572 & 2.7795 & 3.4337 & 3.8547 & 4.0000 & 3.8547 & 3.4337 \\ 0.1351 & 1.0471 & 1.9572 & 2.7795 & 3.4337 & 3.8547 & 4.0000 & 3.8547 \\ -0.6968 & 0.1351 & 1.0471 & 1.9572 & 2.7795 & 3.4337 & 3.8547 & 4.0000 \end{bmatrix} \quad [\text{Eq. 3}]$$

guaranteed to be coherent in a state without disturbance for the number of times corresponding to the number of taps of the adaptive filter 111 to generate the identification input signal x(n).

This enables the signal generator 201 to generate the identification input signal x(n) that includes a frequency having an integer multiple of the fundamental frequency and that has a periodicity satisfying the PE condition.

A matrix obtained by calculating the moving average of the autocorrelation matrix of the identification input signal x(n) that has the periodicity satisfying the PE condition can be a regular constant matrix by using a fundamental period T of the fundamental frequency of the identification input signal x(n) as a time length for calculating the moving average.

In an application to an acoustic system, the signal generator 201 preferably changes a phase of each of the multiple sine wave signals to be added to generate the identification input signal x(n) so that a signal waveform of the identification input signal x(n) does not become impulse-shaped. For example, the signal generator 201 randomly changes the phase of each of the multiple sine wave signals.

Figure 3:
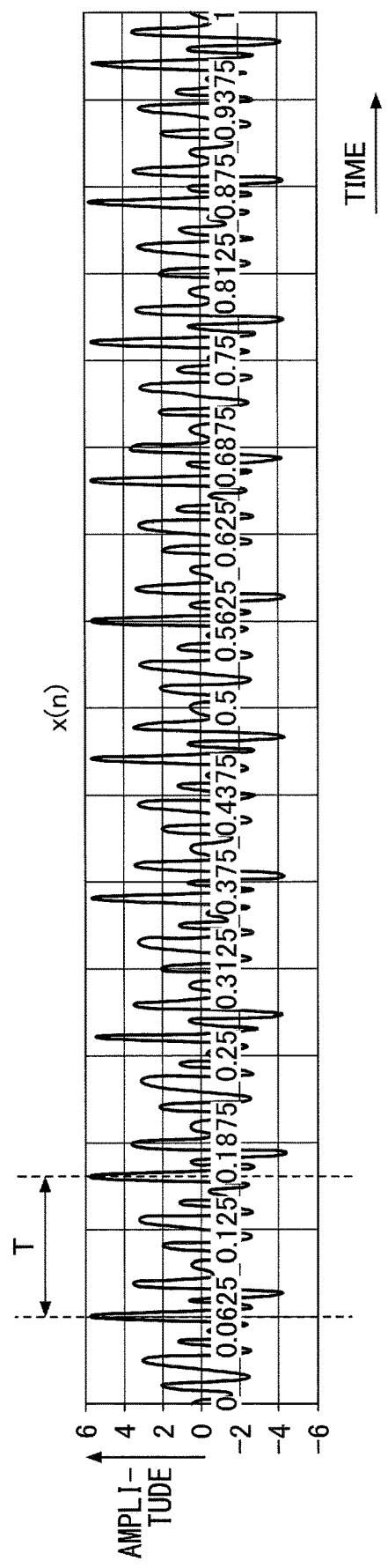
FIG. 3 is a drawing illustrating an image of a signal waveform of an identification input signal according to the embodiment.

FIG. 3 illustrates an image of a signal waveform of the identification input signal x(n) generated by the signal generator 201.

FIG. 3 is a drawing illustrating an image of the signal waveform of the identification input signal according to the embodiment. The example of FIG. 3 illustrates, for example, the identification input signal x(n) generated by synthesizing cosine waves of 30 Hz, 40 Hz, 50 Hz, 60 Hz, 70 Hz, 80 Hz, 90 Hz, and 100 Hz, in the identification model of 8 tap FIR filters, and the fundamental frequency of 10 Hz. In the example of FIG. 3, the signal generator 201 generates the identification input signal x(n) by synthesizing multiple frequency components (i.e., cosine waves) at random phases, thereby generating a periodic signal with a fundamental period T without an impulse-shaped peak.

Here, returning to FIG. 2, the description of the functional configuration of the controller 114 will be continued.

The setting unit 202 sets the moving average time (i.e., the moving average time of the adaptive identification device 110) to the fundamental period T of the identification input signal x(n). For example, when a sampling frequency of the adaptive identification device 110 is 1600 Hz and the fundamental frequency of the identification input signal x(n) is 10 Hz, the setting unit 202 sets the number of moving averages M to 160. Thus, the moving average time of the adaptive identification device 110 is set to 0.1 s, which is the fundamental period of the fundamental frequency of 10 Hz.

In order to further reduce the calculation amount, the calculation unit 203 preferably calculates a matrix obtained by calculating the moving average of the autocorrelation matrix $x(n)x(n)_T$ of the identification input signal vector x(n) in advance, performs eigenvalue decomposition and diagonalization on the calculated matrix to calculate a diagonal matrix, and stores the diagonal matrix in the storage unit 115.

<Adaptive Update>

Next, an adaptive update equation of the adaptive algorithm according to the present embodiment, will be described.

When the adaptive update equation of the approximate steepest descent algorithm described above is modified by separating the step size calculation and the slope calculation, the adaptive update equation can be expressed as follows.

$$w(n+1) = w(n) + \quad [\text{Eq. 4}]$$

$$\mu \left[ \frac{1}{M} \sum_{i=0}^{M-1} \{x(n-i)y(n-i)\} - \left( \frac{1}{M} \sum_{i=0}^{M-1} \{x(n-i)x(n-i)^T\} \right) w(n) \right]$$

In the present embodiment, by using the identification input signal x(n) generated so as to satisfy the above-described condition of PE, a matrix obtained after calculating the moving average of the autocorrelation matrix $x(n)x(n)^T$ of the identification input signal vector x(n), can be a constant. In addition, the constant autocorrelation matrix can be diagonalized by eigenvalue decomposition as follows.

$$\frac{1}{M} \sum_{i=0}^{M-1} \{x(n-i)x(n-i)^T\} = P^{-1}DP \quad [\text{Eq. 5}]$$

$$D = \begin{bmatrix} \lambda_0 & 0 & \cdots & 0 \\ 0 & \lambda_1 & & \\ \vdots & & \ddots & 0 \\ 0 & & 0 & \lambda_{L-1} \end{bmatrix}$$

Here, L is the number of taps of the identification model.

Therefore, the adaptive update equation of the adaptive algorithm according to the present embodiment can be expressed as follows.

$$w(n+1) = w(n) + \mu \left[ \frac{1}{M} \sum_{i=0}^{M-1} \{x(n-i)y(n-i)\} - P^{-1}DPw(n) \right] \quad [\text{Eq. 6}]$$

Furthermore, if we multiply both sides of the equation by the regular matrix P from the left, the following equation can be obtained.

$$Pw(n+1) = Pw(n) + \mu \left[ \frac{1}{M} \sum_{i=0}^{M-1} \{Px(n-i)y(n-i)\} - DPw(n) \right] \quad [\text{Eq. 7}]$$

Moreover, the equation can be expressed as follows where $w'(n)=Pw(n)$, $x'(n)=Px(n-1)$, in a view from a region where a linear transformation is performed by the regular matrix P.

$$w'(n+1) = \quad [\text{Eq. 8}]$$

$$w'(n) + \mu \left[ \frac{1}{M} \sum_{i=0}^{M-1} \{x'(n-i)y(n-i)\} - \begin{bmatrix} \lambda_0 & 0 & \cdots & 0 \\ 0 & \lambda_1 & & \\ \vdots & & \ddots & 0 \\ 0 & & 0 & \lambda_{L-1} \end{bmatrix} w'(n) \right]$$

Thus, according to the present embodiment, the adaptive filter coefficient vector that is calculated by making the autocorrelation matrix $x(n)x(n)^T$ of the identification input signal vector $x(n)$ a constant, and by further linearly transforming the constant by the regular matrix P, is obtained by the product of a diagonal matrix D that consists of eigenvalues. Therefore, according to the present embodiment, the identification accuracy equivalent to the identification accuracy of the approximate steepest descent algorithm can be achieved with a calculation amount smaller than the calculation amount of the approximate steepest descent algorithm.

Since the adaptive filter coefficient vector $w'(n)$ converges in the region linearly transformed with the regular matrix P, when an actual impulse response is to be obtained, the inverse transformation is performed by multiplying both sides of Eq. 9 by an inverse matrix $P^{-1}$ from the left, and the optimum value $w_{opt}$ can be obtained (Eq. 10).

$$w'(\infty) = Pw_{opt} \quad [\text{Eq. 9}]$$

$$P^{-1}w'(\infty) = w_{opt} \quad [\text{Eq. 10}]$$

<Process Flow>

Next, a process flow of the adaptive identification method according to the present embodiment will be described.

Figure 4:
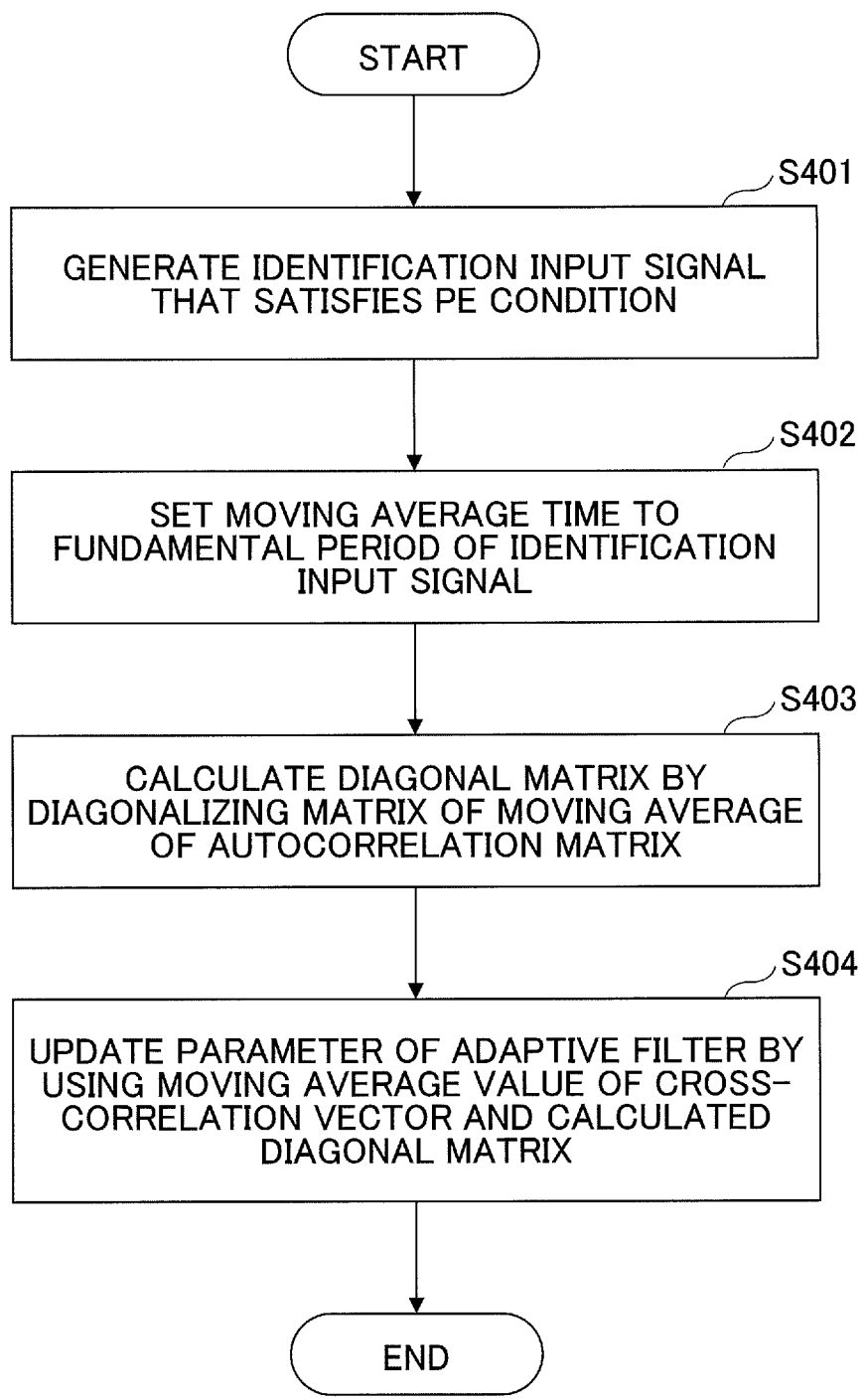
FIG. 4 is a flowchart illustrating an example of a process of the adaptive identification system according to the embodiment.

FIG. 4 is a flowchart illustrating an example of a process of the adaptive identification system according to the embodiment. The process illustrates an entire flow of the adaptive identification method performed by the adaptive identification system 100 according to the present embodiment.

In step S401, as described above, the signal generator 201 of the controller 114 generates the periodic identification input signal x (n) that synthesizes frequency components that are an integer multiple of the fundamental frequency so as to satisfy the PE condition.

For example, the signal generator 201 synthesizes a sine wave signal of an integer multiple of the fundamental frequency (e.g., 10 Hz) by the number of taps of the adaptive filter 111 to generate the periodic identification input signal x(n).

The signal generator 201 causes the phases of multiple sine wave signals to differ from each other so that the identification input signal x(n) does not become impulse-shaped. For example, the signal generator 201 randomly changes the phases of multiple sine wave signals to generate the periodic identification input signal x(n) illustrated in FIG. 3.

Preferably, the signal generator 201 determines the identification input signal x(n) and obtains a matrix D and a matrix P. The following is the matrix D and the matrix P when the number of taps of the adaptive filter 111 is 2, for example.

$$D = \begin{bmatrix} \lambda_0 & 0 \\ 0 & \lambda_1 \end{bmatrix} \quad [\text{Eq. 11}]$$

$$P = \begin{bmatrix} p_{00} & p_{01} \\ p_{10} & p_{11} \end{bmatrix}$$

The signal generator 201 prepares an identification input signal that is linearly transformed, in consideration of the linear transformation by the matrix P (Eq. 12), and stores the identification input signal that is linearly transformed in the storage unit 115 in the following format (Eq. 13).

$$\begin{bmatrix} w'_0(n) \\ w'_1(n) \end{bmatrix} = \begin{bmatrix} p_{00} & p_{01} \\ p_{10} & p_{11} \end{bmatrix} \begin{bmatrix} w_0(n) \\ w_1(n) \end{bmatrix} \quad [\text{Eq. 12}]$$

$$\begin{bmatrix} x'_0(n) \\ x'_1(n) \end{bmatrix} = \begin{bmatrix} p_{00} & p_{01} \\ p_{10} & p_{11} \end{bmatrix} \begin{bmatrix} x_0(n) \\ x_1(n) \end{bmatrix}$$

$$x'_0(n) = p_{00}x_0(n) + p_{01}x_1(n) \quad [\text{Eq. 13}]$$
$$x'_1(n) = p_{10}x_0(n) + p_{11}x_1(n)$$

Preferably, the signal generator 201 generates the identification input signal x(n) based on the identification input signal stored in the storage unit 115 in advance and inputs the generated identification input signal x(n) to the propagation system 11, the adaptive filter 111, and the adaptive algorithm execution unit 112, for example, as illustrated in FIG. 1A.

In step S402, the setting unit 202 of the controller 114 sets the moving average time of the adaptive identification device 110 (i.e., the moving average time of the adaptive algorithm) to the fundamental period T of the identification input signal x(n) generated in step S201.

For example, when the sampling frequency of the adaptive identification device 110 is 1600 Hz and the fundamental frequency of the identification input signal x(n) is 10 Hz, the moving average time of the adaptive identification device 110 is set to 0.1 s, which is the fundamental period T of 10 Hz, which is the fundamental frequency.

In step S403, the calculation unit 203 of the controller 114 calculates the diagonal matrix that is obtained by diagonalizing a matrix obtained by calculating the moving average of the autocorrelation matrix $x(n)x(n)^T$ of the identification input signal vector $x(n)$ generated in step S401.

Here, this process is only required to be performed before the adaptive update process of step S404. For example, the calculation unit 203 may calculate the diagonal matrix and store the calculated diagonal matrix in the storage unit 115 in advance when the calculation unit 203 generates the identification input signal x(n) and stores the generated identification input signal x(n).

In step S404, the adaptive algorithm execution unit 112 updates the coefficients of the adaptive filter 111 by using the moving average value obtained by calculating the moving average of the cross-correlation vector x(n)y(n) of the identification input signal vector x(n) and the observation signal y(n), and the diagonal matrix calculated by the calculation unit 203. For example, if the number of taps in the adaptive filter 111 is 2, the adaptive update process is performed using the following equations as adaptive update equations.

$$w'_0(n+1) = w'_0(n) + \mu \left[ \frac{1}{M} \sum_{i=0}^{M-1} \{x'_0(n-i)y(n-i)\} - \lambda_0 w'_0(n) \right] \quad [\text{Eq. 14}]$$

$$w'_1(n+1) = w'_1(n) + \mu \left[ \frac{1}{M} \sum_{i=0}^{M-1} \{x'_1(n-i)y(n-i)\} - \lambda_1 w'_1(n) \right]$$

For example, if the addition operation of the moving average is a ring buffer method, and three addition operations (data value addition, subtraction, and pointer increment) are performed, the calculation amount required for one adaptation is as follows.

Slope estimation: six multiplications and eight additions

Step size adjustment: two multiplications

Adaptive update: two additions

FIG. 5 is a drawing illustrating an example of the calculation amount of the adaptive identification system according to the embodiment. FIG. 5 illustrates the calculation amount of the approximate steepest descent algorithm and the calculation amount of the present embodiment when the number of taps of the adaptive filter 111 is 2, 128, and L (where L is an integer greater than or equal to 2).

As illustrated in FIG. 5, even when the number of taps of the adaptive filter 111 is 2, the calculation amount of the adaptive algorithm according to the present embodiment is smaller than the calculation amount of the approximate steepest descent algorithm.

In the actual adaptive identification system 100, it is considered that the number of required taps of the adaptive filter 111 is at least 128. In this case, as illustrated in FIG. 5, it can be found that the calculation amount of the adaptive algorithm according to the present embodiment is much smaller than the calculation amount of the approximate steepest descent algorithm. Additionally, the identification accuracy equivalent to the identification accuracy of the approximate steepest descent algorithm can be obtained because the adaptive algorithm according to the present embodiment is based on the approximate steepest descent algorithm.

Therefore, according to the present embodiment, in the adaptive identification system 100, the identification accuracy equivalent to the identification accuracy of the approximate steepest descent algorithm can be obtained with the calculation amount smaller than the calculation amount of the approximate steepest descent algorithm.

The embodiment of the present invention has been described above, but the present invention is not limited to the embodiment described above. The various modifications and alterations can be made within the spirit and scope of the invention described in the claim.

What is claimed is:

1. An adaptive identification system for identifying a characteristic of a propagation system by use of an adaptive filter, the adaptive identification system comprising:
   a signal generator configured to generate an identification input signal including a frequency component that is an integer multiple of a fundamental frequency, the identification input signal having periodicity that is persistently exciting;
   a setting unit configured to set moving average time to a fundamental period of the fundamental frequency of the identification input signal; and
   an adaptive algorithm execution unit configured to use a moving average value and a diagonal matrix to update a coefficient of the adaptive filter, the moving average value being obtained by calculating a moving average of a cross-correlation vector of a vector of the identification input signal and an observation signal with the moving average time, and the diagonal matrix being obtained by diagonalizing a matrix obtained by calculating a moving average of an autocorrelation matrix of the vector of the identification input signal with the moving average time.

2. The adaptive identification system as claimed in claim 1, wherein the signal generator generates the identification input signal including only the frequency component that is an integer multiple of the fundamental frequency.

3. The adaptive identification system as claimed in claim 1, wherein the identification input signal includes a plurality of said frequency components different from each other, the number of the plurality of frequency components corresponding to the number of taps of the adaptive filter.

4. The adaptive identification system as claimed in claim 1, wherein the identification input signal includes a plurality of said frequency components, phases of the plurality of frequency components being different from each other.

5. The adaptive identification system as claimed in claim 1, wherein the signal generator randomly changes phases of a plurality of said frequency components included in the identification input signal.

6. The adaptive identification system as claimed in claim 1, comprising
   a calculation unit configured to calculate the diagonal matrix in advance.

7. The adaptive identification system as claimed in claim 1, comprising
   a storage unit configured to store the diagonal matrix in advance.

8. The adaptive identification system as claimed in claim 7,
   wherein the adaptive algorithm execution unit uses the moving average value and the diagonal matrix stored in the storage unit in advance to update the coefficient of the adaptive filter.

9. An adaptive identification device for identifying a characteristic of a propagation system by use of an adaptive filter, the adaptive identification device comprising:
   a signal generator configured to generate an identification input signal including a frequency component that is an integer multiple of a fundamental frequency, the identification input signal having periodicity that is persistently exciting;
   a setting unit configured to set moving average time to a fundamental period of the fundamental frequency of the identification input signal; and
   an adaptive algorithm execution unit configured to use a moving average value and a diagonal matrix to update a coefficient of the adaptive filter, the moving average value being obtained by calculating a moving average of a cross-correlation vector of a vector of the identification input signal and an observation signal with the moving average time, and the diagonal matrix being obtained by diagonalizing a matrix obtained by calculating a moving average of an autocorrelation matrix of the vector of the identification input signal with the moving average time.

10. An adaptive identification method performed by an adaptive identification system for identifying a characteristic of a propagation system by use of an adaptive filter, the adaptive identification method comprising:
generating an identification input signal including a frequency component that is an integer multiple of a fundamental frequency, the identification input signal having a periodicity that is persistently exciting;
setting moving average time to a fundamental period of the fundamental frequency of the identification input signal; and
using a moving average value and a diagonal matrix to update a coefficient of the adaptive filter, the moving average value being obtained by calculating a moving average of a cross-correlation vector of a vector of the identification input signal and an observation signal with the moving average time, and the diagonal matrix being obtained by diagonalizing a matrix obtained by calculating a moving average of an autocorrelation matrix of the vector of the identification input signal with the moving average time.

* * * * *